United States Patent
Hanaoka

(10) Patent No.: US 7,123,640 B2
(45) Date of Patent: Oct. 17, 2006

(54) NITRIDE SEMICONDUCTOR LASER DEVICE CHIP AND LASER APPARATUS INCLUDING THE SAME

(75) Inventor: Daisuke Hanaoka, Soraku-Gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 209 days.

(21) Appl. No.: 10/620,865

(22) Filed: Jul. 15, 2003

(65) Prior Publication Data

US 2004/0013149 A1    Jan. 22, 2004

(30) Foreign Application Priority Data

Jul. 17, 2002  (JP) .............................. 2002-208640

(51) Int. Cl.
  *H01S 5/20* (2006.01)
(52) U.S. Cl. ................. 372/45.01; 372/46.01
(58) Field of Classification Search .................. 372/45, 372/46, 54, 45.01, 46.01
  See application file for complete search history.

(56) References Cited

U.S. PATENT DOCUMENTS 6,925,101 B1 *  8/2005  Matsumura .............. 372/46.01

2002/0039374 A1 *  4/2002  Onomura et al. ............. 372/46
2002/0105981 A1 *  8/2002  Gen-ei et al. .................. 372/36
2003/0210720 A1 * 11/2003  Reid ............................ 372/46

FOREIGN PATENT DOCUMENTS

JP       11-340571       12/1999

* cited by examiner

Primary Examiner—Minsun Oh Harvey
Assistant Examiner—Tod T. Van Roy
(74) Attorney, Agent, or Firm—Morrison & Foerster LLP

(57) ABSTRACT

A nitride semiconductor laser device chip has a nitride semiconductor stacked-layered structure including an n-type layer, an active layer and a p-type layer stacked successively on a main surface of a nitride semiconductor substrate. A ridge stripe structure is formed in a portion of the p-type layer. The chip has a length L1 of more than 500 μm in a longitudinal direction of the stripe structure and a length L2 of more than 200 μm in a width direction of the stripe structure, and L1/L2 is more than 2.5.

7 Claims, 6 Drawing Sheets

NITRIDE SEMICONDUCTOR LASER DEVICE CHIP AND LASER APPARATUS INCLUDING THE SAME

BACKGROUND OF THE INVENTION

1. Field of the Invention

The present invention relates to improvement of a nitride semiconductor laser device chip and of a nitride semiconductor laser apparatus including the same.

The nitride semiconductor described herein includes $Al_xGa_yIn_zN$ ($0 \leq x \leq 1$, $0 \leq y \leq 1$, $0 \leq z \leq 1$, $x+y+z=1$). In the nitride semiconductor, less than about 10% of the nitrogen element may be substituted with at least one element of As, P and Sb (provided that the hexagonal crystal system is maintained). Further, the nitride semiconductor may be doped with at least one of Si, O, Cl, S, C, Ge, Zn, Cd, Mg and Be.

2. Description of the Background Art

FIG. 6 is a schematic cross sectional view of a nitride semiconductor laser device chip disclosed in Japanese Patent Laying-Open No. 11-340571. In this laser device chip, an n-side clad layer 801, an n-side light guide layer 802, an active layer 803, a p-side light guide layer 804, a p-side clad layer 805, a p-side contact layer 806, an insulating film 807, and a p-electrode 808 are successively formed on one main surface of a nitride semiconductor substrate 800 comprised of a plurality of layers. An n-side contact layer 809 and an n-electrode 810 comprised of a plurality of layers are formed on the other main surface of substrate 800.

The laser device chip of FIG. 6 is 400 μm long in the longitudinal direction of its resonator, and 400 μm long in the width direction of the resonator.

The n-electrode side of the laser device chip of FIG. 6 is attached by thermocompression to a heat sink metallized with Au, and an Au wire is used to provide the chip with an electrical connection, to produce a nitride semiconductor laser apparatus.

As described above, in a conventional nitride semiconductor laser device chip, special attention has not been paid to its shape and dimensions, and the laser device chip normally has four sides of approximately the same lengths.

The inventors, however, have found through a variety of studies about the shape and dimensions of the nitride semiconductor laser device chip that the laser operating lifetime of the laser device is affected by the shape and dimensions of the chip.

SUMMARY OF THE INVENTION

In view of the foregoing, an object of the present invention is to provide a nitride semiconductor laser device chip having an improved laser operating lifetime and a laser apparatus including the same by optimizing shape and dimensions of the nitride semiconductor laser device chip.

According to the present invention, the nitride semiconductor laser device chip has a nitride semiconductor stacked-layered structure including an n-type layer, an active layer and a p-type layer stacked successively on a main surface of a nitride semiconductor substrate, and has a ridge stripe structure formed in a portion of the p-type layer. The chip has a length L1 of more than 500 μm in a longitudinal direction of the stripe structure, and a length L2 of more than 200 μm in a width direction of the stripe structure, where L1/L2 is more than 2.5.

A total thickness of the nitride semiconductor substrate and the nitride semiconductor stacked-layered structure is preferably more than 50 μm and less than 200 μm. The stripe structure is preferably formed at a position more than 10 μm away in the width direction from an side edge of the chip.

According to the present invention, the nitride semiconductor laser apparatus includes the nitride semiconductor laser device chip having optimized shape and dimensions as described above and a support member for placing the nitride semiconductor laser device chip thereon.

Here, the support member refers to a portion on which a nitride semiconductor laser device chip is placed. For example, in the case that the laser device chip is placed at chip mounting part of a stem in the nitride semiconductor laser apparatus, the chip mounting portion corresponds to the support member. In the case that the chip is placed via a submount, the submount corresponds to the support member.

The support member preferably has a thermal expansion coefficient that is greater than that of the nitride semiconductor substrate. The support member preferably includes one of Al, Ag, Cu, Au, Fe, Al—SiC, CuW and BeO. Further, a solder for joining the nitride semiconductor laser device chip to the support member preferably includes one of AuSn, AgSn, AuSi, AuGe, PbSn, InSn and AgCuSn.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
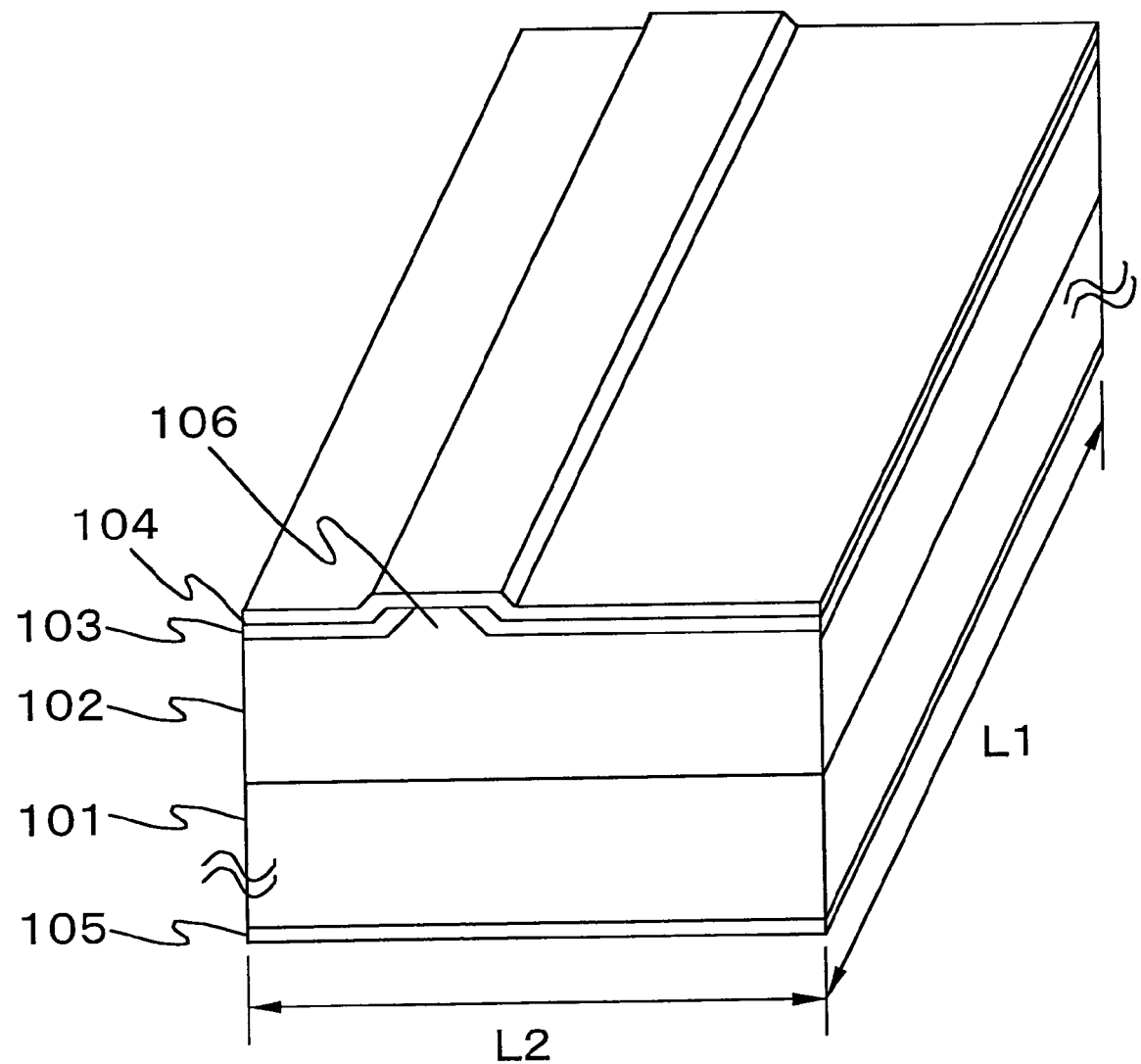
FIG. 1 is a schematic perspective view showing an example of a nitride semiconductor laser device chip according to the present invention.

In FIG. 1, an example of the nitride semiconductor laser device chip according to the present invention is shown in a schematic perspective view. This nitride semiconductor laser device chip has a nitride semiconductor stacked-layered structure 102 including an n-type nitride semiconductor layer, a nitride semiconductor active layer and a p-type nitride semiconductor layer on a main surface of a nitride semiconductor substrate 101, and a ridge stripe structure 106 is formed at a part of the p-type nitride semiconductor layer.

In the laser device chip of FIG. 1, a chip length in the longitudinal direction of the stripe structure 106 is represented by L1, and a chip length in the width direction of stripe structure 106 is represented by L2.

Figure 2:
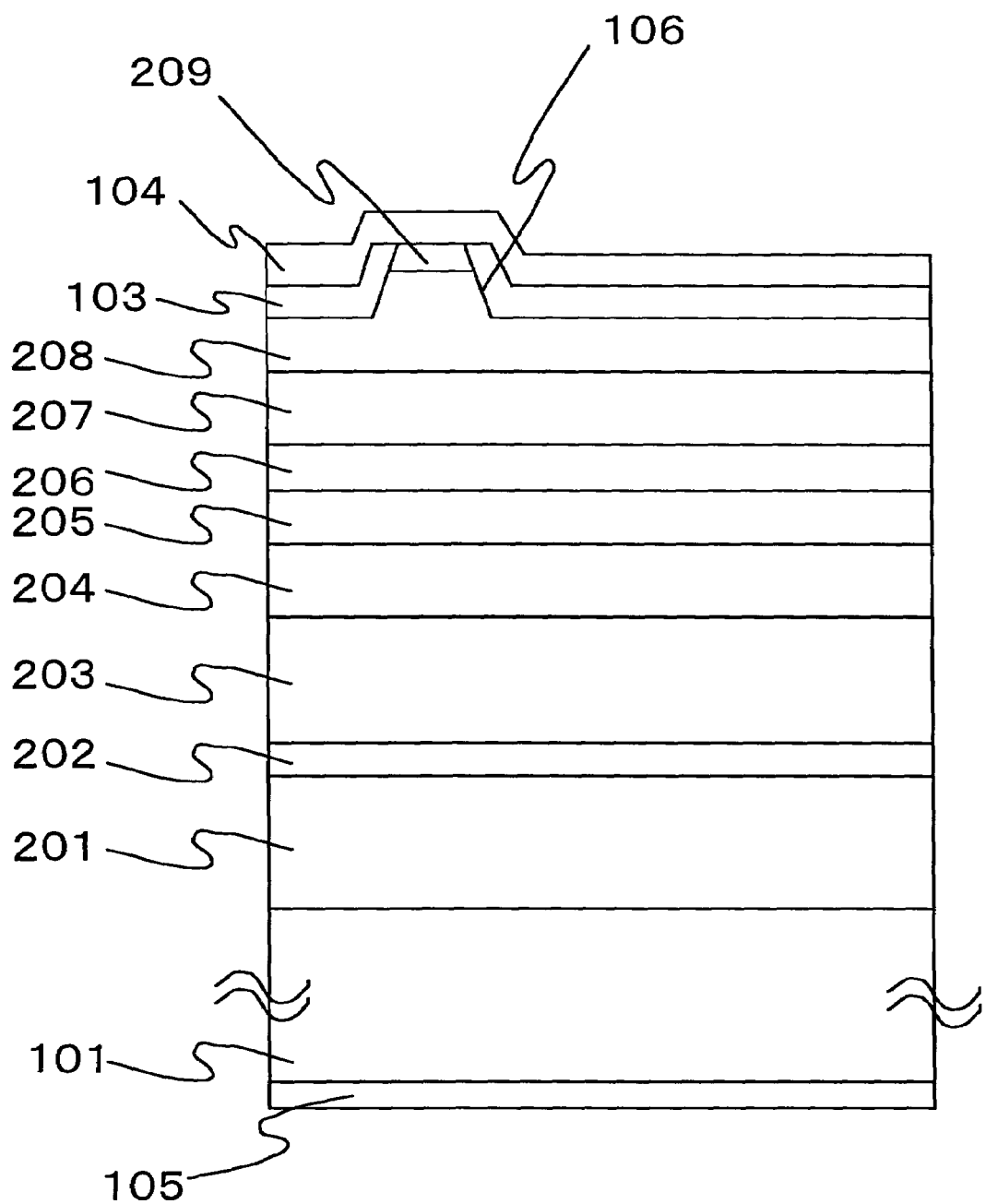
FIG. 2 is a schematic cross sectional view showing details of a stacked-layered structure of the laser device chip of FIG. 1.

In FIG. 2, details of the stacked-layered structure in the laser device chip are shown in a cross section orthogonal to the longitudinal direction of the stripe structure. Specifically, the laser device chip of FIG. 2 includes a nitride semiconductor stacked-layered structure formed on n-type GaN substrate 101, and the stacked-layered structure includes an n-GaN layer 201, an n-$Ga_{0.93}In_{0.07}N$ anti-crack layer 202, an n-$Al_{0.10}Ga_{0.90}N$ dad layer 203, an n-GaN guide layer 204, a GaInN multiple quantum well active layer 205, a p-$Al_{0.20}Ga_{0.80}N$ carrier barrier layer 206, a p-GaN guide layer 207, a p-$Al_{0.10}Ga_{0.90}N$ clad layer 208, and a p-GaN contact layer 209 which are stacked successively.

A ridge 106 in a stripe shape is formed with p clad layer 208 and p contact layer 209, which extends in the direction of a resonator. An insulating film 103 is provided between p-type electrode 104 and the nitride semiconductor stacked-layered structure, except over the top of the ridge portion 106. That is, the nitride semiconductor laser device chip of the present invention has a so-called ridge stripe type structure. N-type electrode 105 is formed on the back side of n-type GaN substrate 101.

A manufacturing process of the nitride semiconductor laser device chip of the present invention is now described with reference to FIGS. 1 and 2.

Firstly, a conventional method is applied as appropriate to obtain a wafer in which a stacked-layered structure of nitride semiconductor layers 201–209 is deposited on a first main surface of a nitride semiconductor substrate 101, a plurality of ridge stripe structures are formed thereon, and an insulating film 103 and a p-type electrode 104 are further formed thereon. In this case, the width of the ridge stripe portion 106 is set to 1.5 μm. Insulating film 103 is formed of $SiO_2$, and p-type electrode 104 is formed of a multilayer metal film of Pd/Mo/Au stacked in this order from the side in contact with p contact layer 209.

Next, n-type GaN substrate 101 is polished or etched from the second main surface side, to adjust the thickness of the wafer including substrate 101 to p-type electrode 104 to 150 μm. N-type electrode 105 is formed on the back side of the wafer. Here, n-type electrode 105 is formed of a multilayer metal film of Ti/Al/Mo/Pt/Au stacked in this order from the substrate 101 side.

Thereafter, the wafer is divided into a plurality of nitride semiconductor laser device chips in the following manner. The wafer is placed on a stage, with the GaN substrate 101 side facing up. An optical microscope is used to make alignment of positions to be scratched. Scribe lines are provided on the GaN substrate 101 side with a diamond point. Thereafter, an adequate force is applied to the wafer to divide it along the scribe lines, so that a plurality of nitride semiconductor laser device chips, each as shown in FIGS. 1 and 2, are obtained.

Although the scribing method using the diamond point has been described above, another method may of course be employed for the chip division. For example, a dicing method where a wire saw or a thin blade is used for scratching or cutting, a laser scribing method where heating by laser beam irradiation of excimer laser or the like and the following rapid cooling are employed to produce cracks as scribe lines in the irradiated portion, or a laser abrasion method where a portion irradiated by laser light of high energy density is vaporized to form grooves, may also be used for the chip division.

The above-described chip dividing method is used to obtain laser device chips as shown in FIGS. 1 and 2. Here, nitride semiconductor laser device chips of various shapes and dimensions are fabricated. In each case, ridge stripe 106 is formed at a position more than 10 μm away in the width direction of the ridge stripe from the edge of the chip.

Thereafter, the nitride semiconductor laser device chip is mounted on a stem or the like by die bonding, and an electrical connection for the chip is formed, so that a nitride semiconductor laser apparatus is obtained. Here, if a portion of the nitride semiconductor laser apparatus at which the laser device chip is placed is referred to as a support member, then the support member corresponds to a chip mounting portion in the case that the laser device chip is directly placed at the chip mounting portion of the stem, whereas the support member corresponds to a submount in the case that the laser device chip is placed via the submount. A solder joint or the like may be employed to fix the laser device chip to the support member.

Figure 5:
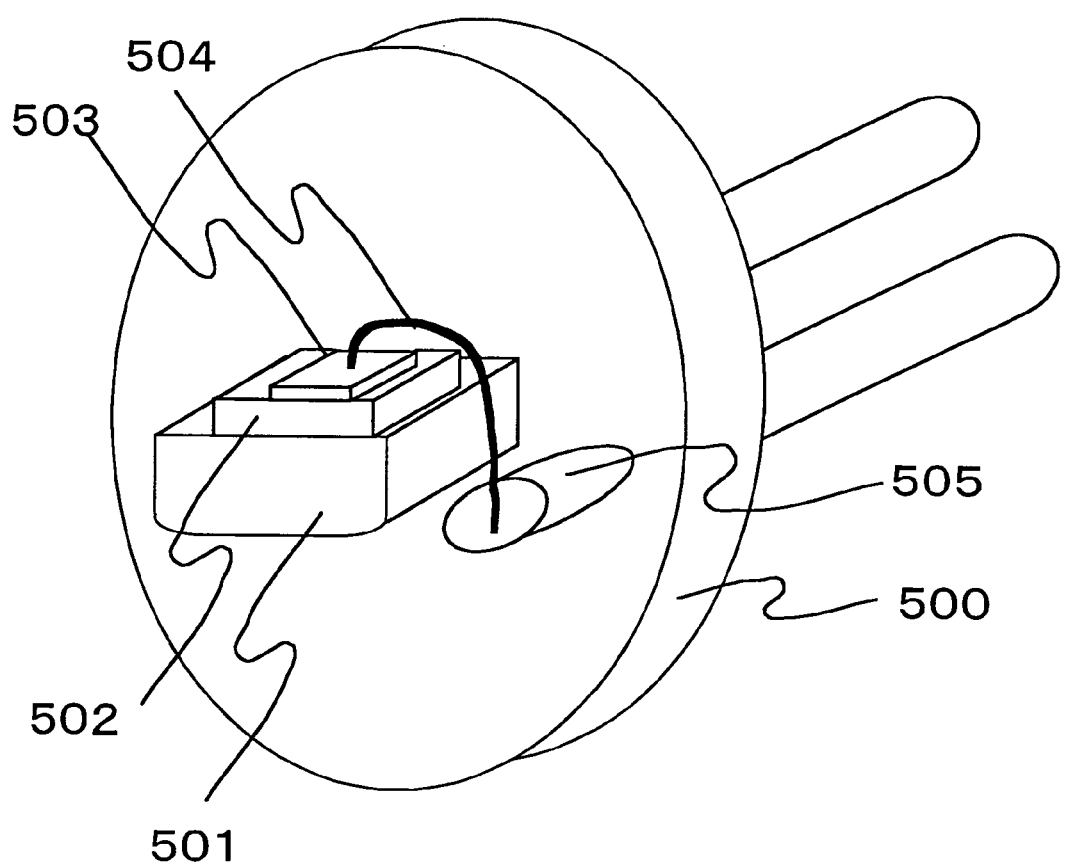
FIG. 5 is a schematic perspective view showing an example of a nitride semiconductor laser apparatus according to the present invention.
Figure 6:
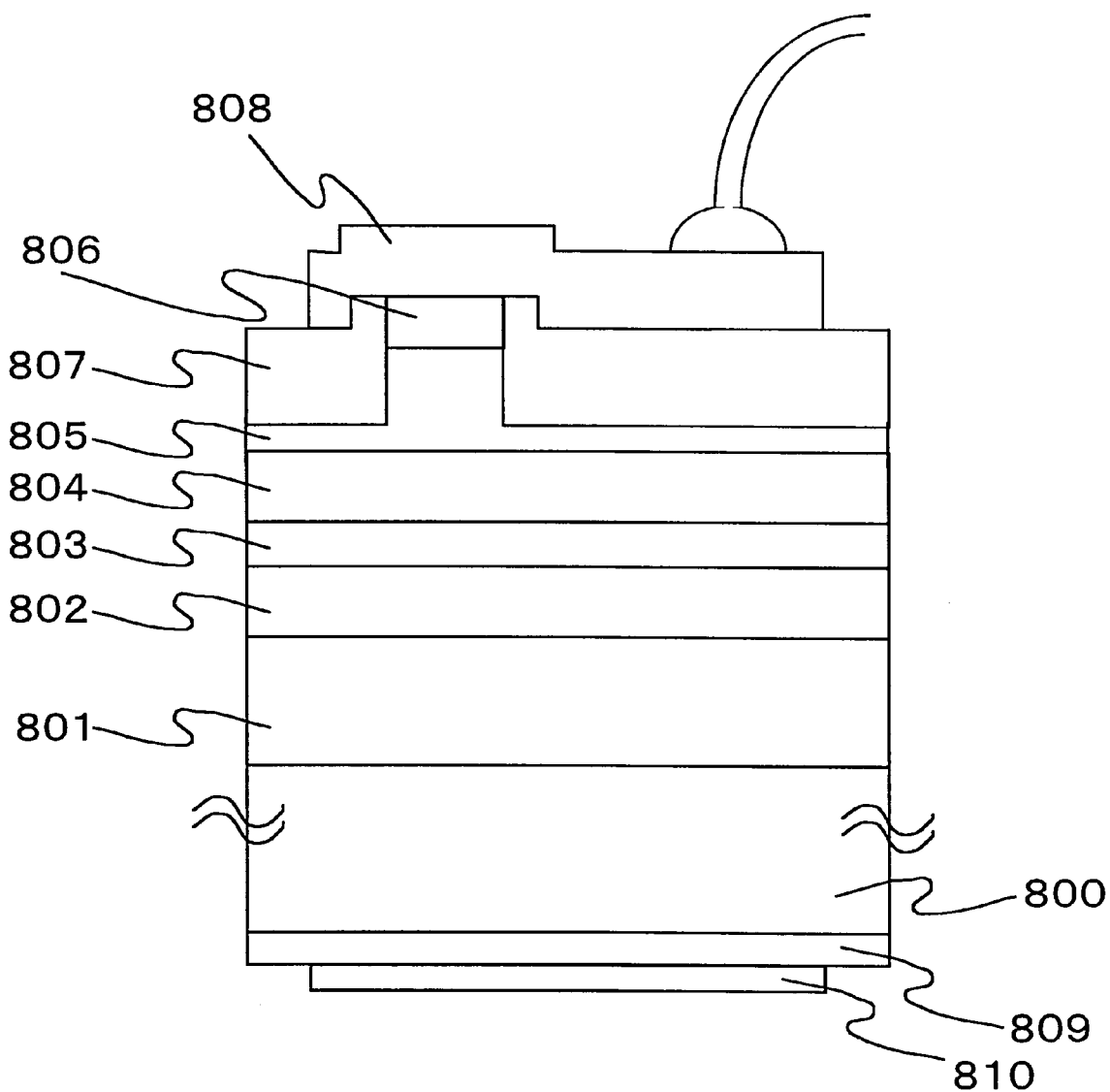
FIG. 6 is a schematic cross sectional view showing a stacked-layered structure of a conventional nitride semiconductor laser device chip.

In FIG. 5, an example of the nitride semiconductor laser apparatus produced in the above-described manner is shown in a schematic perspective view. Specifically, the nitride semiconductor laser apparatus includes a stem 500, a chip mounting portion 501, a submount 502 as the support member, a laser device chip 503, a lead wire 504, and a pin 505. In this example, laser device chip 503 is mounted on submount 502 of Cu using an AuSn solder. Alternatively, laser device chip 503 may be joined directly to chip mounting portion 501, omitting submount 502 as desired.

A plurality of nitride semiconductor laser apparatuses having laser device chips varied in chip length L1 in the longitudinal direction of the ridge stripe and in chip length L2 in the width direction of the ridge stripe were produced as described above and subjected to a laser operating lifetime test. The following are results of the test.

Firstly, it has been found that the laser operating lifetime becomes extremely short when L1 is less than 500 μm and L2 is less than 200 μm. In this case, heat dissipation efficiency of the laser device chip is poor because its overall dimension is small, and thus, the influence of heat generated during the laser operation is considered to be more remarkable. Degradation of the laser device becomes faster due to the influence of the heat, so that the laser operating lifetime becomes very short. In addition, when L2 is less than 200 μm, at the time of bonding of the lead wire for forming an electrical connection with the outside, a region available for bonding the wire on the p-type electrode surface without damaging the ridge stripe portion becomes small in size, so that the yield of the laser apparatuses is liable to decrease.

Next, the laser operating lifetime test was performed on a plurality of nitride semiconductor laser apparatuses having varied ratios of L1/L2 with L1 of more than 500 μm and L2 of more than 200 μm. It has been found that the laser operating lifetime tends to begin to be elongated when L1 is more than twice the length of L2. It has also been found that the effect of elongated laser operating lifetime is clearly observed when L1 becomes more than 2.5 times longer than L2.

Figure 3:
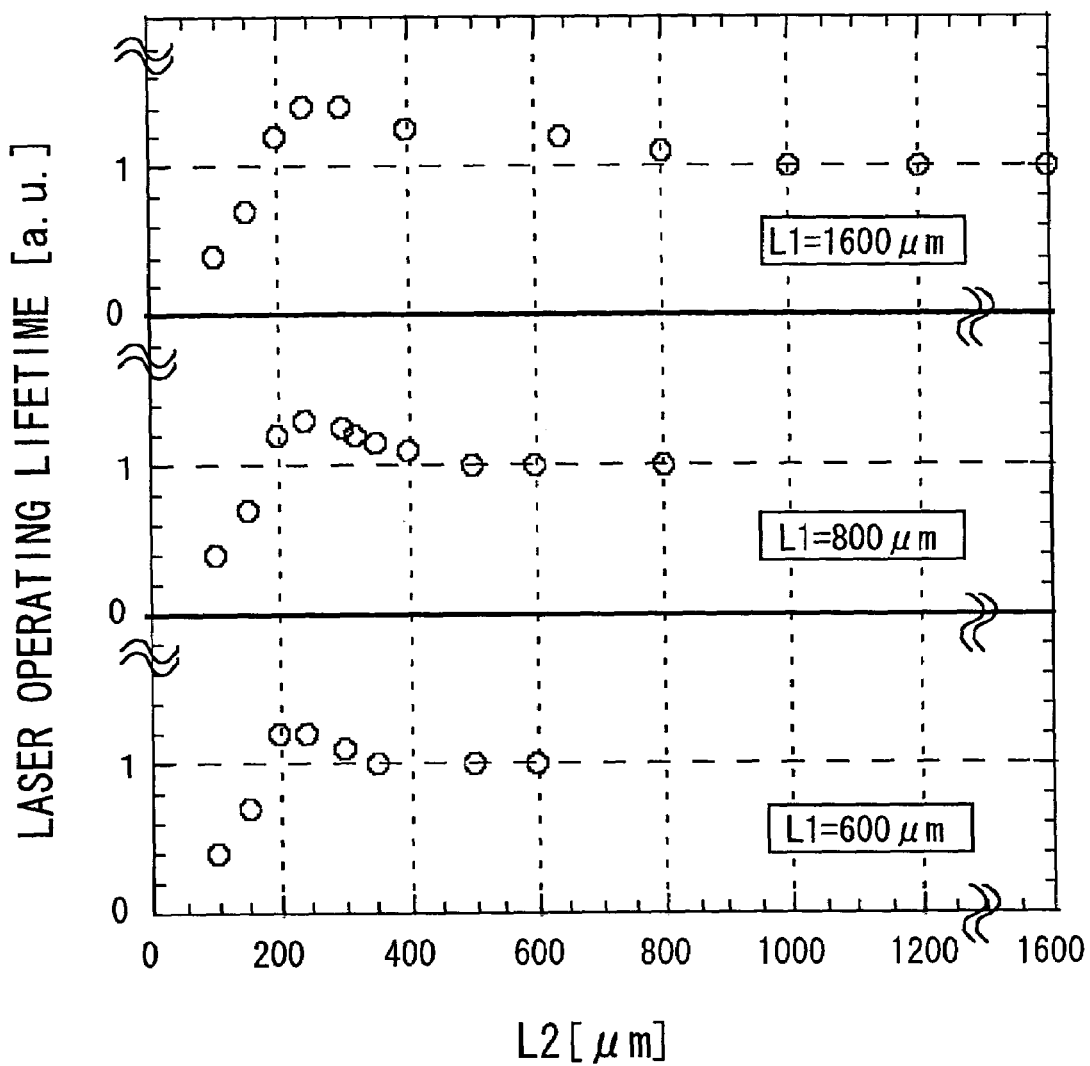
FIG. 3 is a graph showing the influence of the shape and dimensions of the laser device chip on the laser operating lifetime.

The graph of FIG. 3 shows changes of laser operating lifetime dependent on changes of L2 in the cases of L1 of 600 μm, 800 μm, and 1600 μm. In this graph, the horizontal axis represents L2 (μm) and the vertical axis represents the laser operating lifetime in an arbitrary unit (a.u.). In the arbitrary unit, the laser operating lifetime corresponding to the case of L1=L2 is set to a reference value 1.

As seen from FIG. 3, the laser operating lifetime hardly depends on L2 in a range of L1/L2 of less than 2. The laser operating lifetime, however, begins to be elongated when L1/L2 becomes more than twice. Further, the effect of elongated laser operating lifetime is clearly seen when L1/L2 becomes more than 2.5. As the ratio of L1/L2 was further increased, however, the laser operating lifetime became dramatically short when L2 became less than 200 μm, no matter how long L1 was. The similar tendencies were observed for the influence of the ratio of L1/L2 on the laser operating lifetime for the cases also other than the three values of L1 shown in FIG. 3, presumably because of the following factors.

As shown in FIG. 2, the nitride semiconductor laser device chip includes nitride semiconductor substrate 101 and a plurality of nitride semiconductor layers 201–209 stacked thereon. The respective nitride semiconductor layers are formed with compositions suitable for their functions. As a result, internal stress due to crystal lattice strain occurs between the nitride semiconductor layers of different compositions.

Specifically, when a wafer including nitride semiconductor substrate 101 and a plurality of nitride semiconductor layers 201–209 stacked thereon is formed, large stress exists within the wafer. Further, the respective layers have different thermal expansion coefficients. Thus, when the wafer is placed at room temperature after formation of the nitride semiconductor stacked-layered structure at high temperature, internal stress occurs due to the different thermal expansion coefficients, making the wafer bowing. Still further, when the wafer is reduced in thickness by polishing or etching the nitride semiconductor substrate, the degree of bowing of the wafer due to the internal stress may become large. When the wafer including such internal stress is divided into laser device chips, the internal stress changes depending on the shapes and dimensions of the laser device chips (in this case, particularly depending on the ratio between L1 and L2), thereby affecting the laser operating lifetime of the laser apparatus. It is considered that a proper stress state is occurred in the laser device chip when L1/L2 is more than 2, and preferably more than 2.5.

In addition, the above-described bowing may cause poor adhesion in mounting the laser device chip on the support member, causing degradation of the laser device characteristics due to the problem of heat dissipation efficiency and the like. According to the present invention, however, it is possible to reduce the adverse effect of bowing particularly in a direction parallel to the width direction of the ridge stripe in the laser device chip. With L2 of less than 200 μm, however, the adverse effect due to the decreased heat dissipation efficiency would exceed the favorable effect of the present invention, thereby leading to shortening of the laser operating lifetime.

In the above-described case, the thickness of the wafer is reduced by polishing or etching n-type GaN substrate 101. The effect of the present invention can be obtained normally when the wafer thickness is adjusted to the order of 40–250 μm. When the wafer is appropriately thin in this range, it is possible to transmit the internal stress to the ridge stripe portion. In other words, the lasing threshold current tends to decrease advantageously when proper stress is applied to the ridge stripe portion. If the wafer is thinner than the above-described range, the bowing of the laser device chip becomes too large, which causes poor adhesion in mounting the chip on the support member, thereby degrading the laser device characteristics. On the other hand, if the wafer is too thick, it becomes difficult to apply proper stress to the ridge stripe portion, in which case the effect of the present invention cannot be obtained sufficiently.

Further, it is more preferable to adjust the wafer thickness in a range of 50–200 μm. That is, another advantage is obtained by making the thin wafer in this range, in which end surface mirrors of the laser device chip can be formed by cleavage readily and stably.

In FIG. 5, Cu submount 502 has been shown by way of example as the support member to which the laser device chip is placed. The effect of the present invention can further be enhanced by using, as the support member, submount 502 or chip mounting portion 501 of the stem made of a material having a larger thermal expansion coefficient than that of nitride semiconductor substrate 101. For example, Al, Ag, Cu, Au, Fe, Al—SiC, CuW or BeO is preferably used. Here, Cu refers to any material whose main component is Cu, which includes copper alloy containing Cu as its main component. The same applies to the other materials. It is particularly preferable to use among them a material having a high heat conductivity.

In mounting the nitride semiconductor laser device chip on the support member such as the submount or the chip mounting portion of stem, a solder of AuSn, AgSn, AuSi, AuGe, PbSn, InSn or AgCuSn, or a mixture thereof may preferably be used for joining them.

In FIG. 5, the laser apparatus has been produced in a state of so-called junction-up where the substrate side is mounted on the stem or the like. The similar effect can be obtained even when the laser apparatus is produced in a state of so-called junction-down where the nitride semiconductor stacked-layered structure side is mounted on the support member.

Description is now given about a result of study on how the position of the ridge stripe in the nitride semiconductor laser device chip affects the laser device characteristics.

Firstly, L1 and L2 were set to 800 μm and 300 μm respectively in the nitride semiconductor laser device chip having the stacked-layered structure as shown in FIGS. 1 and 2. The position of the ridge stripe in the laser device chip was varied in a range of 10 μm to 150 μm (the center of the chip) in the width direction of the stripe from an origin set at the edge of the chip.

Figure 4:
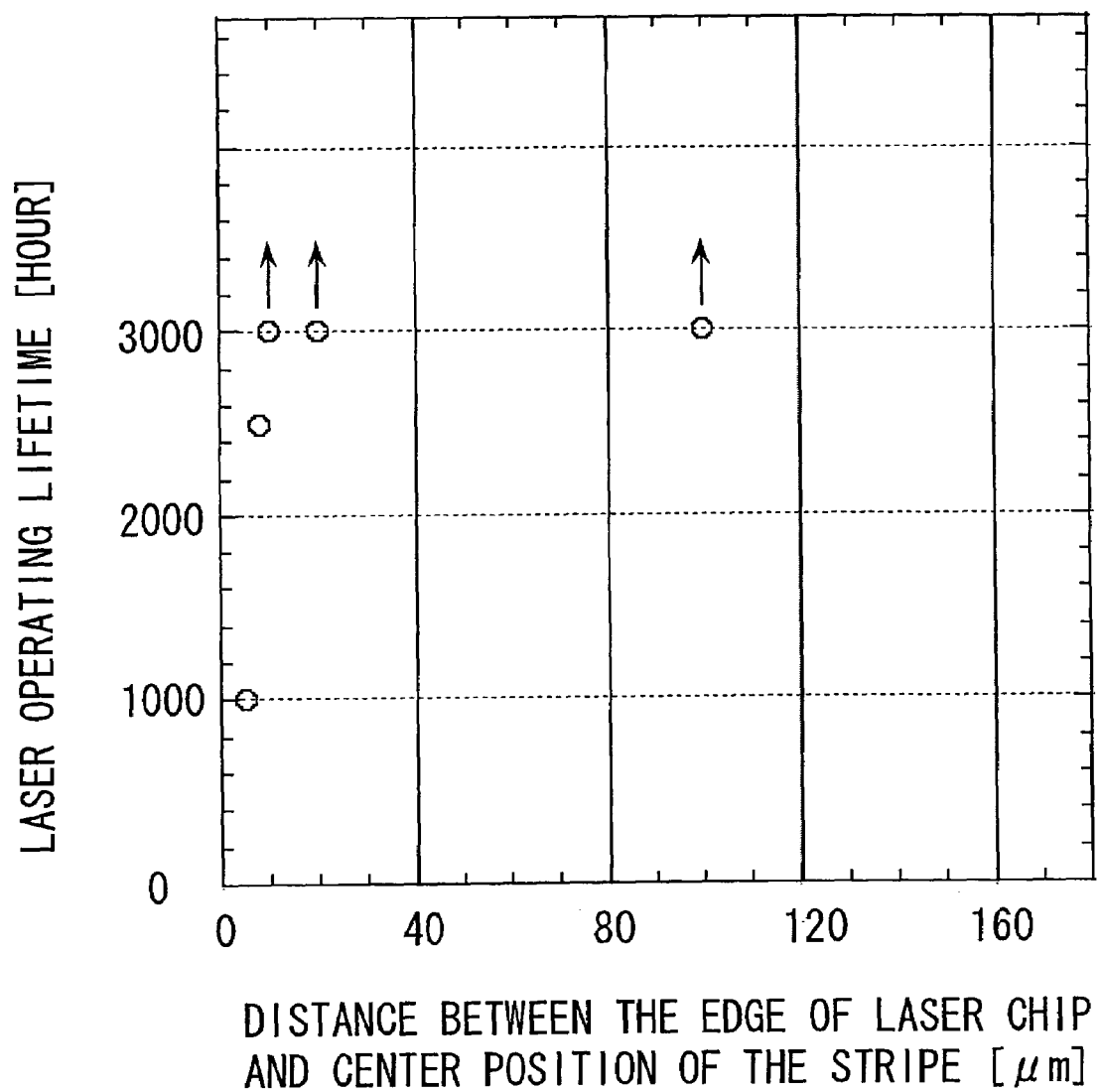
FIG. 4 is a graph showing the influence of the ridge stripe forming position in the laser device chip on the laser operating lifetime.

The plurality of laser device chips having their ridge stripe positions varied as described above were used to produce a plurality of laser apparatuses as shown in FIG. 5, which were subjected to laser operating lifetime tests. As a result, a lasing operation over a long lifetime was confirmed with a laser apparatus having the ridge stripe structure formed at a position more than 10 μm inward (to the chip center side) from the edge of the laser device chip, as shown in FIG. 4. This presumably is for the following reasons.

In the present invention, the shape and dimensions of the nitride semiconductor laser device chip are optimized to achieve a long laser operating lifetime. That is, in the nitride semiconductor laser apparatus of the present invention, it is considered that stress applied to the ridge stripe portion which corresponds to a light-emitting region is maintained in an appropriate state by optimizing the shape and dimensions of the chip. If the ridge stripe portion is formed at the edge of the laser device chip, stress distribution in the ridge stripe portion would become uneven due to the influence of discontinuity of the edge portion, thereby hindering application of adequate stress to the ridge stripe portion. In addition, crystal defects or the like are liable to occur near the light emitting layer because of the uneven stress distribution, which may degrade the laser device characteristics with the increase of the non-radiative region.

In tests of laser apparatuses having laser device chips varied in shapes and dimensions in the range of L1 of more than 500 μm, L2 of more than 200 μm and L1/L2 of more than 2.5, lasing operation over a long lifetime was also confirmed in a laser apparatus having the ridge stripe structure formed at a position more than 10 μm inward from the edge of the laser device chip.

As described above, according to the present invention, it is possible to provide a nitride semiconductor laser device chip having an improved laser operating lifetime and a laser apparatus including the same by optimizing shape and dimensions of the nitride semiconductor laser device chip.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nitride semiconductor laser apparatus comprising a nitride semiconductor laser device chip, a support member for placing said chip thereon, and a solder for joining said laser device chip to said support member, wherein:
    said chip has a nitride semiconductor stacked-layered structure of a hexagonal crystal system including an n-type layer, an active layer and a p-type layer successively stacked on a first main surface of a nitride semiconductor substrate of the same hexagonal crystal system and has a ridge stripe structure formed in a portion of said p-type layer;
    said chip has a length L1 of more than 500 μm in a longitudinal direction of said stripe structure and a length L2 of more than 200 μm and less than 300 μm in a width direction of said stripe structure, and L1/L2 is more than 2.5;
    a total thickness of said nitride semiconductor substrate and said nitride semiconductor stacked-layered structure is more than 50 μm and less than 200 μm;
    a multilayer metal film including an outermost layer of Au is formed on said nitride semiconductor laser device chip;
    said outermost layer of Au is bonded to said support member with said solder; and
    said solder includes one of AuSn, AgSn, AuGe, PbSn, InSn, and AgCuSn.

2. The nitride semiconductor laser apparatus of claim 1, wherein said stripe structure is formed at a position more than 10 μm away in the width direction of said stripe structure from an edge of said chip.

3. The nitride semiconductor laser apparatus of claim 1, wherein said support member has a larger thermal expansion coefficient as compared to said nitride semiconductor substrate.

4. The nitride semiconductor laser apparatus of claim 1, wherein said support member includes one of Al, Ag, Cu, Au, Fe, Al—SiC, CuW and BeO.

5. The nitride semiconductor laser apparatus of claim 1, wherein:
    a multilayer metal film including an outermost layer of Au is formed on a second main surface of the nitride semiconductor substrate opposite said first main surface; and
    said outermost layer of Au is connected to said support member of by said solder.

6. The nitride semiconductor laser apparatus of claim 1, wherein:
    a multilayer metal film including an outermost layer of Au is formed on said nitride semiconductor stacked-layer structure; and
    said outermost layer of Au is connected to said support member by said solder.

7. The nitride semiconductor laser apparatus of claim 1, wherein said chip has a first pair of side surfaces parallel to and a second pair of side surfaces perpendicular to the longitudinal direction of said stripe structure, only said second pair of side surfaces being formed by cleavage.

* * * * *